United States Patent [19]

Olver

[11] Patent Number: 4,560,945
[45] Date of Patent: Dec. 24, 1985

[54] ADAPTIVE FEEDFORWARD CANCELLATION TECHNIQUE THAT IS EFFECTIVE IN REDUCING AMPLIFIER HARMONIC DISTORTION PRODUCTS AS WELL AS INTERMODULATION DISTORTION PRODUCTS

[75] Inventor: Terence E. Olver, Baltimore, Md.

[73] Assignee: Westinghouse Electric Corp., Pittsburgh, Pa.

[21] Appl. No.: 647,209

[22] Filed: Sep. 4, 1984

[51] Int. Cl.[4] .............................................. H03F 1/26
[52] U.S. Cl. ................................... 330/149; 328/163; 330/151; 455/63; 455/303
[58] Field of Search ....................... 330/147, 149, 151; 328/163, 165; 455/63, 65, 223, 224, 303–306

[56] References Cited

U.S. PATENT DOCUMENTS 4,389,618  6/1983  Bauman .......................... 330/151 X Primary Examiner—James B. Mullins
Attorney, Agent, or Firm—W. G. Sutcliff

[57] ABSTRACT

An improved feedforward cancellation amplifier is disclosed, characterized by the arrangement of an adaptive cancellation modulator for each fundamental input signal at the input of a power bank amplifier. With such an arrangement, phase and amplitude modulation for adaptive cancellation of each fundamental signal is performed in the power amplification path of the feedforward canceller. Accordingly, the harmonics produced by the modulators for each fundamental signal are cancelled in the output of the power bank amplifier and the signal levels at the input to the power bank amplifier are less than those in the input sample path of the canceller.

9 Claims, 2 Drawing Figures

ADAPTIVE FEEDFORWARD CANCELLATION TECHNIQUE THAT IS EFFECTIVE IN REDUCING AMPLIFIER HARMONIC DISTORTION PRODUCTS AS WELL AS INTERMODULATION DISTORTION PRODUCTS

BACKGROUND OF THE INVENTION

Modern high frequency (HF) and other communication systems require extremely linear broadband amplifiers to provide secure jam-free transmissions. Non-linear amplifiers are characterized by the generation of harmonic distortion of the fundamental signals driving the amplifiers and by the generation of intermodulation products between two or more fundamental signals. Obtaining low levels of harmonic and intermodulation distortion is much more difficult in broadband amplifiers than in amplifiers with tuned selectivity.

The practical realization of linear broadband amplifiers is possible only by employing feedforward cancellation. Feedforward cancellation techniques include passive cancellation which provides an improvement of 20 to 30 dB in linearity over the HF band of 2 to 30 MHz and adaptive cancellation which provides deep null cancellation in the cancellation circuits of residues of the fundamental signals being transmitted. The deep null cancellation can be maintained over the dynamic transmission bandwidth of the fundamental signal. Thus, deep null cancellation in the cancellation circuits is important because it improves the overall cancellation obtainable for the amplifier and it permits a reduction in the size of the cancellation amplifiers, thereby improving the general efficiency of the amplifier.

BRIEF DESCRIPTION OF THE PRIOR ART

Contemporary adaptive cancellation systems employ modulators to control the phase and amplitude of signals used in the cancellation processes. The modulators of the contempory systems are located in the fundamental canceller part of the feedforward canceller. While the prior adaptive cancellation systems normally operate quite satisfactorily, they do possess the inherent drawback that the harmonic distortion of the fundamental signals generated by and inherent to the modulators is coupled into the output of the amplifiers. This harmonic distortion limits the cleanliness of the amplifier outputs and is a constraint in operating the amplifier with a number of different fundamental drive signals. The transmission of power at harmonically related frequencies from any fundamental signal prohibits the use of these frequencies by other fundamental signals. Although these harmonics can be reduced to a fairly low level by providing strings of diodes, this greatly increases the complexity and cost of the modulator design while still not completely removing the harmonics, thereby posing a problem in the selection of operating frequencies for multi-fundamental signal transmissions.

The present invention was developed in order to overcome these and other drawbacks of contemporary adaptive cancellation systems by relocating the modulators in the input to the power bank, whereby the harmonics generted are at a much lower level because of the reduced signal level input to the modulators. At a lower level, the harmonics are commensurate with intermodulation product levels and they no longer act as a restriction on the selection of operational frequencies within the high frequency band. Furthermore, the harmonics are subject to the cancellation improvement of the cancellation stages.

SUMMARY OF THE INVENTION

Accordingly, it is a primary object of the present invention to provide a feedforward cancellation system including a plurality of inputs for receiving a plurality of fundamental tone signals, respectively, a power bank amplifier, and adaptive and passive feedforward cancellation circuits. The adaptive feedforward cancellation circuit includes a plurality of modulators each connecting one of the inputs with the input of the power bank amplifier which amplifies the fundamental tone signals to produce a power output signal. The passive cancellation circuit has a first input for receiving a sample of the power output signal and a second input connected with the signal inputs for receiving samples of the fundamental tone signals. The passive cancellation circuit compares the power output signal sample with the fundamental tone signal samples to produce a residue signal which is combined with the power output signal. The modulators of the adaptive feedforward cancellation circuit each include a first input connected with the output of the passive feedforward cancellation circuit for receiving a sample of the residue signal and a second input connected with the associated signal input for receiving a corresponding fundamental tone signal. The modulators perform amplitude and phase modulation on the fundamental tone signals to obtain and maintain deep cancellation nulls on each fundamental tone signal, whereby harmonic distortion is reduced.

According to a further object of the invention, adder circuits are provided to combine the fundamental tone signals delivered to the power bank amplifier and to combine the fundamental tone signal samples delivered to the passive feedforward cancellation circuit. Similarly, a divider circuit is provided to divide the sample of the residue signal by the number of inputs for delivery to the first inputs of the modulators.

It is another object of the invention to provide amplifiers for each of the fundamental tone signals and for the residue signal.

According to yet another object of the invention, delay circuits are provided at the output of the power bank amplifier and between the fundamental tone signal sample adder circuit and the passive feedforward cancellation circuit.

BRIEF DESCRIPTION OF THE FIGURES

Other objects and advantages of the subject invention will become apparent from a study of the following specification when viewed in the light of the accompanying drawing, in which.

DETAILED DESCRIPTION

Figure 1:
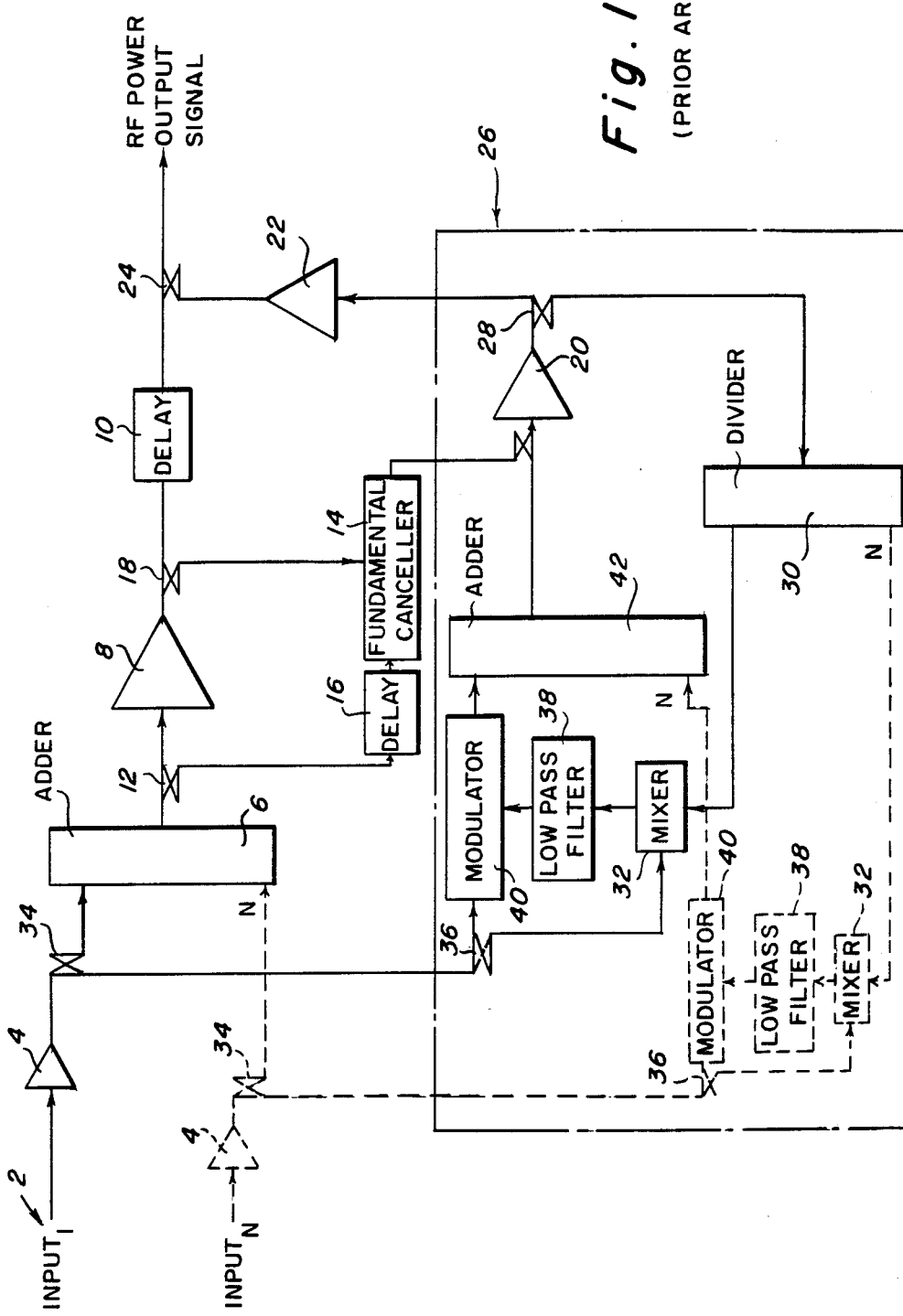
FIG. 1 is a block diagram of a contemporary adaptive feedforward cancellation circuit and power bank amplifier.

A contemporary design for a high performance feedforward cancellation circuit (or linearizer) is shown in FIG. 1 in combination with a power bank amplifier. Fundamental tone signals are injected into the inputs 2 of the amplifier and into exciter signal amplifiers 4, there being one input and exciter amplifier for each fundamental tone signals. Accordingly, there are N inputs for N fundamental signals. The fundamental tone signals are combined in an adder circuit 6 to drive a power bank amplifier 8 which amplifies the fundamental tone signals to generate an RF power output signal via a delay line 10 as will be developed below.

A coupling device 12 at the output of the adder circuit 6 takes a sample of the combined fundamental tone signals and delivers it to a fundamental canceller 24 via a delay line 26. Similarly, a coupling device 18 at the output of the power bank amplifier takes a sample of the power output signal and delivers it to the fundamental canceller 14 where it is compared with the sample of combined fundamental tone signals. Equalization, that is, phase and amplitude matching, of the two samples is performed by the fundamental canceller on the basis of the best compromise over the entire frequency band of the input signals. This equalization is called passive broadband equalization.

The two samples are subtracted from each other resulting in a residue signal containing distortion components, small fundamental tone signal components, and uncancelled noise components. More particularly, the distortion components include harmonics and intermodulation products generated by the power bank amplifier. The fundamental tone signal components result from imperfections in the broadband matching process, whereby the samples of the combined fundamental tone signals and the power output signal may not be exactly equal. Accordingly, following subtraction in the canceller 14, some small fundamental tone signal components (i.e. between 1/100 and 1/1000 of the level of the fundamental signal input to the canceller) will be left in the residue. Finally, the uncancelled noise components result from noise generated by the power bank amplifier which is not cancelled by the fundamental canceller 14.

The residue signal from the fundamental canceller is delivered via a preamplifier 20, to the input of a cancellation amplifier 22 which raises the level of the components of the residue signal and injects them out of phase back into the output of the power bank amplifier 8 via a coupling device 24. The gain of the cancellation amplifier is chosen to maintain a sufficient amplitude match across the band. The delay line 10 at the output of the power bank amplifier 8 matches the phase delays of the output signal with those incurred by the residue signal passing through the cancellation amplifier 22. Accordingly, the distortion components of the residue signal are cancelled. However, the cancellation amplifier 22 also generates distortion and noise components which are injected into the power output signal by the coupler 24.

The distortion components generated by the cancellation amplifier result from the presence of the small fundamental tone components in the residue signal in the same manner, but to a lesser degree, as the distortion components are generated by the power bank amplifier 8. Similary the noise power generated by the cancellation amplifier 22 which is injected into the power output signal by the coupler 24 is less than that generated by the power bank amplifier 8 because the cancellation amplifier is designed for a much better noise performance than the power bank amplifier since it does not have to handle large input signals.

In effect, the passive cancellation process substitutes the distortion products and the noise properties of the cancellation amplifier for those of the power bank amplifiers. Since the properties of the cancellation amplifier are superior to the those of the power bank amplifier, the overall performance of the amplifier is improved.

The fundamental tone signal components which are in the residue signal and are injected into the cancellation amplifier determine the level of distortion products generated by the cancellation amplifier. In order to reduce the distortion levels and improve the operation of the amplifier, an adaptive fundamental signal cancellation circuit 26 is employed.

A sample of the residue signal is taken from the output of the preamplifier 20 by a coupling device 28 and delivered to a divider circuit 30 where the residue signal sample is divided into a number N of samples corresponding with the number of fundamental tone signals. Each of the N residue signal samples is delivered to a mixer 32 which also receives a sample of one of the fundamental tone exciter signals via the couplers 34 and 36. Each mixer compares a separate sample of the exciter signals with the residue signal sample to produce an output signal which is filtered by a low pass filter 38 to remove signal components not associated with that particular exciter signal. A sample of each exciter signal is delivered to a separate phase and amplitude modulator 40 together with the output of the corresponding filter which is used, in a negative feedback sense, to control the action of the modulators.

The modulators control the fundamental tone exciter signals samples in phase and amplitude to cancel the fundamental tone components from the residue signal. The modulated signals are delivered to an adder circuit 42 where they are combined for transmission to the cancellation amplifier 22 via the preamplifier 20. In effect, the modulators null out the fundamental tone exciter signals at the input to the cancellation amplifier. Accordingly, the performance of the cancellation amplifier is improved since the fundamental tone components of the residue signal are now greatly reduced in amplitude. Furthermore, the adaptive properties of the circuit continue to operate even with minor changes in phase or amplitude of the signal samples being injected into the fundamental canceller 14, such as may occur with drifts in the amplifying properties of the power bank amplifier 8. Additional cancellation stages may be provided to further improve the linearity of the amplifier.

As noted earlier, the primary drawback of contemporary feedforward cancellation circuits such as shown in FIG. 1 results from the harmonics of each fundamental tone exciter signal generated by the modulators. The harmonics produced by the modulators do not pass through the canceller, but are fed directly into the power output signal degrading the harmonic performance of the amplifier. Reduction of harmonic distortion greatly increases the complexity of the modulator. The modulators are designed to handle as high signal levels as possible in order to keep the gain of the cancellation amplifier as low as possible to reduce the noise which it injects into the power output signal. The net result is a highly complex modulator which still restricts the overall performance of the power bank amplifier.

Figure 2:
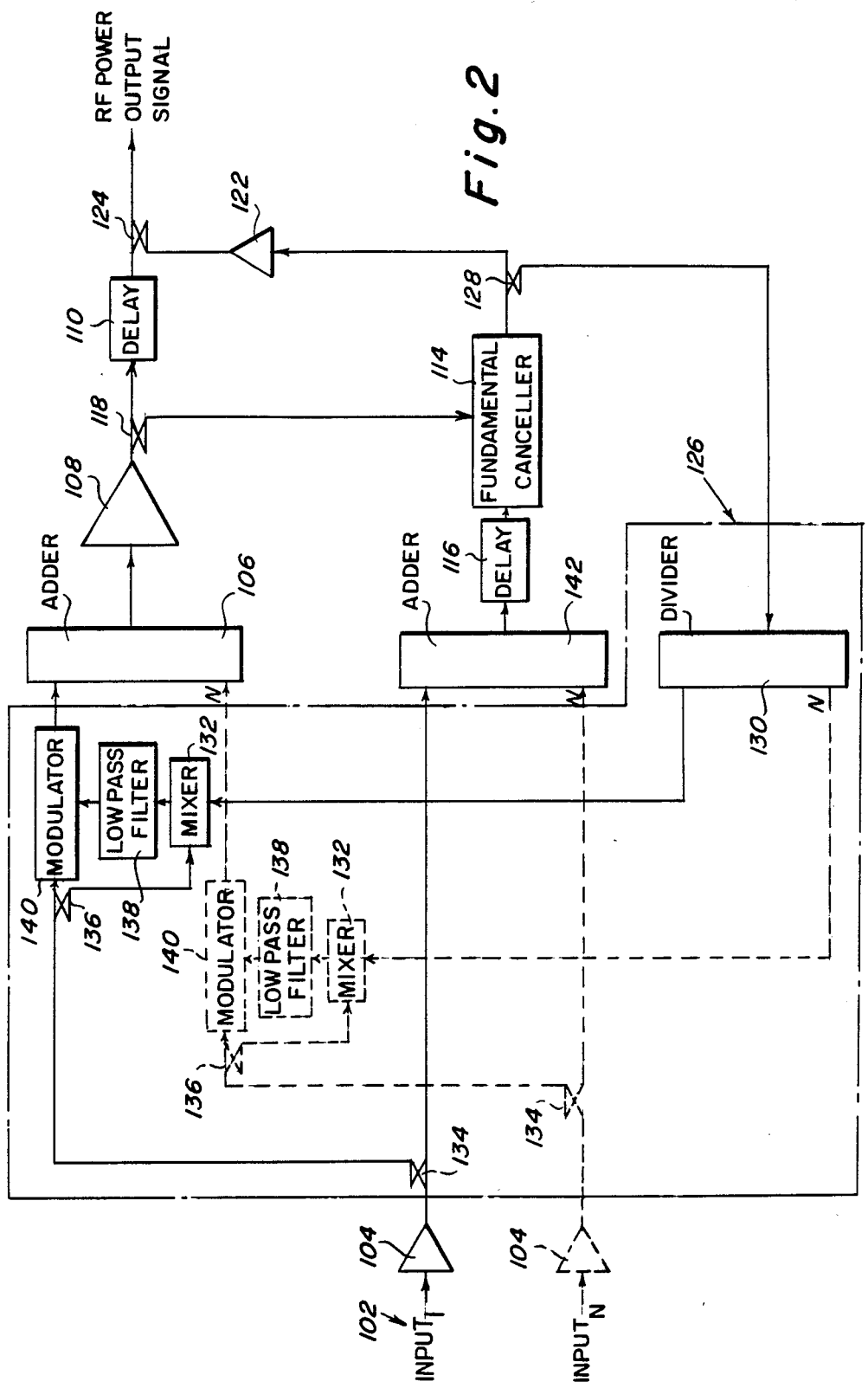
FIG. 2 is a block diagram of the feedforward cancellation amplfier according to the subject invention having adaptive cancellation circuits at the input to the power bank amplifier.

Referring now to FIG. 2, the feedforward cancellation amplifier of the subject invention having adaptive cancellation circuits at the input to the power bank amplifier will be described.

A plurality of inputs 102 receive a plurality of different fundamental tone signals, respectively, which are then amplified by exciter amplifier 104. Connected with each exciter amplifier is a modulator 140 comprising a portion of the adaptive cancellation circuit 126 as will be developed in greater detail below.

The modulator outputs are connected with an adder circuit 106 to combine the modulated fundamental tone signals for delivery to the input of a power bank amplifier 108 which amplifies the combined modulated fundamental tone signal to generate an RF power output signal via a delay line 110. A coupling device 118 at the output of the power bank amplifier delivers a sample of the power output signal to a fundamental canceller circuit 114.

Coupling devices 134 take respective samples of the fundamental tone exciter signals and deliver them to an adder circuit 142 where they are combined for delivery to the fundamental canceller 114 via a delay line 116.

The fundamental canceller 114 compares the power output sample with the combined fundamental tone exciter samples for passive broadband equalization to produce a residue signal which is delivered to a cancellation amplifier 122 which raises the level of the components of the residue signal and injects them out of phase into the output of the power bank amplifier 108 via the coupling device 124. As before, the delay line 110 at the output of the power bank amplifier 108 matches the phase delays of the output signal with those incurred by the residue signal passing through the cancellation amplifier to cancel the distortion.

A sample of the residue signal is taken from the output of the fundamental canceller 114 by the coupler 128 for delivery to the adaptive cancellation circuit 126. Specifically, the residue signal sample is delivered to a divider circuit 130 where the sample is divided into a number N of samples corresponding with the number of fundamental tone signals. Each residue signal sample is delivered to a mixer 132 associated with each input. Each mixer further receives a sample of the fundamental tone exciter signal as taken by the coupling device 136 connected with the output of the associated exciter amplifier 104. Each mixer compares the corresponding sample of the fundamental tone exciter signal with the residue signal sample to produce an output signal which is filtered by the low pass filter 138 to remove signal components not associated with the particular exciter signal. A sample of the corresponding fundamental tone exciter signals is delivered to a phase and amplitude modulator 140 together with the output of the associated filter. The modulated outputs are combined by the adder 106 for delivery to the power bank amplifier 108 which produces the power output signal.

In accordance with the invention, phase and amplitude modulation for adaptive cancellation of each fundamental tone exciter signal is performed in the power amplification path of the device and not in the input sample path as in the prior feedforward cancellation devices. The adaptive negative feedback modulation of each fundamental tone exciter signal to obtain a deep null of the exciter signal at the output of the fundamental canceller is controlled by the level of the signal appearing in the residue signal from the fundamental canceller. By locating the modulators in the power generating path of the feedforward canceller two significant advantages are obtained.

First, the harmonics generated by the modulators 140 are cancelled in the output of the power bank amplifier in the same manner as the power bank amplifier harmonics and intermodulation products are cancelled. The improvement to harmonic levels may be as much as 30 dB for one stage of cancellation.

Second, the signal levels at the input to the power bank amplifier are much lower than the levels in input sample path from the adder 142. As noted above, it is desirable to operate at as high a signal level as possible in the input sample path in order to minimize the gain of the cancellation amplifier 122 and its noise contribution to the output of the amplifier. Harmonic levels generated by the modulators are gerater for larger input signals. Accordingly, in prior feedforward cancellers which provide the modulators in the input sample path, larger levels of harmonics are generated than would be generated by the arrangement of the modulators at the input to the power bank in accordance with the feedforward canceller of the present invention. Thus, signal levels at the input to the power bank amplifier can be more than 10 dB lower than the signal level in the input sample path.

It will be apparent to those skilled in the art that additional cancellation stages may be provided in the feedforward canceller of the subject invention to further improve the linearity of the output signal, with corresponding adaptive cancellation phase and amplitude control signals in series with the inputs.

While in accordance with the provisions of the Patent Statutes the preferred forms and embodiments of the invention have been illustrated and described, it will be apparent to those skilled in the art that various changes and modifications may be made without deviating from the inventive concepts set forth above.

What is claimed is:

1. A feedforward cancellation circuit, comprising
   (a) a plurality of input circuit means for receiving a plurality of fundamental tone signals, respectively;
   (b) power bank amplifier means;
   (c) adaptive feedforward cancellation means including a plurality of modulator means each connecting one of said input circuit means with the input of said power bank amplifier means, respectively, said power bank amplifier means amplifying said fundamental tone signals to produce a power output signal; and
   (d) passive feedforward cancellation means having a first input for receiving a sample of said power output signal and a second input connected with said input circuit means for receiving samples of said fundamental tone signals, said passive cancellation means comparing said power output signal sample with said fundamental tone signal samples to produce a residue signal which is combined with said power output signal;
   (e) said modulator means each including a first input connected with the output of said passive feedforward cancellation means for receiving a sample of said residue signal and a second input connected with its associated input circuit means for receiving a corresponding fundamental tone signal, said modulator means modulating the phase and amplitude of said fundamental tone signals, thereby to adaptively obtain and maintain deep cancellation nulls on each fundamental tone signal, respectively, whereby harmonic distortion is reduced.

2. Apparatus as defined in claim 1, and further comprising frst adder circuit means for connecting the ouputs of said modulator means with the input of said power bank amplifier means, said first adder circuit means combining said modulated fundamental tone signals.

3. Apparatus as defined in claim 2, and further comprising second adder circuit means for connecting said input circuit means with said second input of said passive feedforward cancellation means, said second adder circuit means combining said fundamental tone signal samples.

4. Apparatus as defined in claim 3, and further comprising divider circuit means connecting the output of said passive feedforward cancellation means with said first inputs of said modulator means, said divider circuit means dividing said residue signal sample into a plurality of residue signal samples corresponding with the number of fundamental tone signals.

5. A feedforward cancellation amplifier, comprising
 (a) a plurality of inputs for receiving a plurality of fundamental tone signals, respectively;
 (b) adaptive feedforward cancellation means including a plurality of modulator means connected with each of said inputs, respectively, for amplitude and phase modulation of said fundamental signals;
 (c) first adder circuit means connected with the outputs of said modulator means for combining said amplitude and phase modulated fundamental signals;
 (d) power bank amplifier means connected with said first adder circuit means for producing an amplified power output signal;
 (e) first coupling means connected with the output of power bank amplifier means for producing a sample of said power output signal;
 (f) second coupling means connected with each of said inputs, respectively, for producing samples of said fundamental signals, respectively;
 (g) second adder circuit means connected with said second coupling means for combining said fundamental signal samples;
 (h) fundamental cancellation circuit means having a first input connected with said first coupling means for receiving said power output sample and having a second input connected with said second adder circuit means for receiving said combined fundamental signal sample, said fundamental cancellation circuit means comparing said power output sample with said combined fundamental signal sample for cancellation, thereby to produce a residue signal;
 (i) third coupling means for combining said residue signal with said amplified power output signal;
 (j) fourth coupling means connected with said fundamental cancellation circuit means for producing a sample of said residue signal;
 (k) divider circuit means connected with said fourth coupling means for dividing said residue signal sample into a plurality of residue signal samples corresponding with the number of fundamental tone signals, each of said residue signal samples being delivered to said modulator means, respectively, for adaptive feedback modulation and cancellation of each fundamental tone signal, whereby harmonic distortion is reduced.

6. Apparatus as defined in claim 5, wherein said adaptive feedforward cancellation means further includes
 (1) fifth coupling means connected with said second coupling means for providing a portion of said fundamental signal sample;
 (2) mixer means having a first input for receiving said fundamental signal sample portion and a second input for receiving said divided residue signal sample, said mixer means comparing said sample portion of said fundamental signal with the residue signal sample of said fundamental cancellation circuit; and
 (3) low pass filter means for filtering the output from said mixer means to control the operation of said amplitude and phase modulator means.

7. Apparatus as defined in claim 6, and further comprising a plurality of input amplifier means connected with said inputs, respectively, for amplifying said fundamental signals.

8. Apparatus as defined in claim 7, and further comprising cancellation amplifier means connected between said third and fourth coupling means for amplifying said residue signal.

9. Apparatus as defined in claim 8, and further comprising first delay circuit means connected between said first and third coupling means, and second delay circuit means connected between said second adder circuit means and said fundamental cancellation circuit means.

* * * * *